United States Patent [19]
Christopherson et al.

[11] Patent Number: 5,475,693
[45] Date of Patent: Dec. 12, 1995

[54] ERROR MANAGEMENT PROCESSES FOR FLASH EEPROM MEMORY ARRAYS

[75] Inventors: Mark Christopherson, Folsom; Steven Wells, Citrus Heights; Greg Atwood, San Jose; Mark Bauer, Cameron Park; Albert Fazio, Los Gatos; Robert Hasbun, Shingle Springs, all of Calif.

[73] Assignee: Intel Corporation, Santa Clara, Calif.

[21] Appl. No.: 364,546

[22] Filed: Dec. 27, 1994

[51] Int. Cl.⁶ .................................................. G06F 11/00
[52] U.S. Cl. ...................... 371/10.2; 371/21.4; 371/21.6
[58] Field of Search .................................. 371/10.2, 10.3, 371/16.5, 21.1, 21.4, 21.6, 28

[56] References Cited

U.S. PATENT DOCUMENTS 5,200,959  4/1993  Gross et al. .......................... 371/21.6
5,274,646  12/1993  Brey et al. ............................ 371/21.6

Primary Examiner—Vincent P. Canney
Attorney, Agent, or Firm—Blakely, Sokoloff, Taylor & Zafman

[57] ABSTRACT

A method of utilizing circuitry including error detecting and correcting circuitry to detect and correct errors which can occur in data stored in multi-bit per cell format in a flash EEPROM memory array before those errors can affect the accuracy of data provided by a flash EEPROM memory array.

18 Claims, 6 Drawing Sheets

|       |   |   |   |   | Parity |
|-------|---|---|---|---|--------|
|       | 1 | 1 | 0 | 1 | 1      |
|       | 1 | 1 | 1 | 1 | 0      |
|       | 0 | 0 | 1 | 0 | 1      |
|       | 1 | 0 | 0 | 0 | 1      |
| Parity | 1 | 0 | 0 | 0 |        |

Figure 6

ERROR MANAGEMENT PROCESSES FOR FLASH EEPROM MEMORY ARRAYS

BACKGROUND OF THE INVENTION

1. Field Of The Invention

This invention relates to flash EEPROM memory arrays, and more particularly, to methods and apparatus for providing error management for such arrays.

2. History Of The Prior Art

Recently, flash (flash EEPROM memory) has been used as a new form of long term storage. A flash EEPROM memory array is constructed of a large plurality of floating-gate metal-oxide-silicon field effect transistor devices arranged as memory cells in typical row and column fashion with circuitry for accessing individual cells and placing the memory transistors of those cells in different memory conditions. Such memory transistors may be programmed by storing a charge on the floating gate. This charge remains when power is removed from the array. The charge level may be detected by interrogating the devices. These arrays may be designed to provide a smaller lighter functional equivalent of a hard disk drive which operates more rapidly and is not as sensitive to physical damage. Flash EEPROM memory arrays are especially useful in portable computers where space is at a premium and weight is extremely important.

As originally devised, each flash EEPROM memory device stores a single bit of data. If a flash EEPROM memory device is programmed so that charge is stored on the floating gate, the state is typically referred to as a "zero" or programmed state; while if little or no charge is stored on the gate, this is typically considered a "one" or erased state. Recently, it has been discovered that the transistor devices used for flash EEPROM memory arrays may be made to store charge at a number of distinct levels greater than the charge level of the erased state. Essentially, four or more distinct levels of charge (including the erased level) may be stored on the floating gates of the devices during programming and erasing by varying the voltages applied to the terminals of the devices and the duration of application; and these different charge levels (device conditions or states) may be detected. This allows flash EEPROM devices in memory arrays to store more than one bit per device and radically increases the storage capacity of such arrays. A device used in this manner is referred to as a multi-bit cell.

There are a number of problems which arise from the storage of more than one bit of data in a flash EEPROM cell. Because the maximum charge which may be stored is essentially fixed for any particular memory device, the differences between charge levels which indicate the different data values stored by the cell are much smaller when a number of levels are stored. The different charge levels are sensed by comparison to charge levels on reference cells. Over time, charge tends to leak from the floating gates of some of the memory devices. What would be relatively minor leakage from the floating gate of a device storing only a single bit of data may change the charge level of a multi-bit cell sufficiently to produce an incorrect value for comparison to a reference charge level. Consequently, there is chance for more errors to be caused by charge leakage from the floating gates of individual flash EEPROM cells arranged to store a number of different charge levels.

It is desirable to be able to correct errors caused by leakage from the floating gates of flash EEPROM memory devices so that those errors do not affect the accuracy of data stored.

SUMMARY OF THE INVENTION

It is, therefore, an object of the present invention to provide apparatus and a method for assuring the integrity of the data stored in flash EEPROM memory arrays in which the memory devices are each capable of storing more than one bit of data.

These and other objects of the present invention are realized utilizing apparatus including error detecting and correcting circuitry and a method of utilizing this circuitry to detect and correct errors which can occur in data stored in multi-bit per cell format in a flash EEPROM memory array before those errors can affect the accuracy of data provided by a flash EEPROM memory array.

These and other objects and features of the invention will be better understood by reference to the detailed description which follows taken together with the drawings in which like elements are referred to by like designations throughout the several views.

BRIEF DESCRIPTION OF THE DRAWINGS

FIG. 6 is a diagram illustrating the use of error detecting and correcting circuitry.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

In this specification, a signal which includes a "#" in its name is considered to be an active low signal. The term "assert" as applied to a signal indicates that signal is active independent of whether the level of the signal is low or high. The term "de-assert" indicates that a signal is inactive.

DETAILED DESCRIPTION

Figure 1:
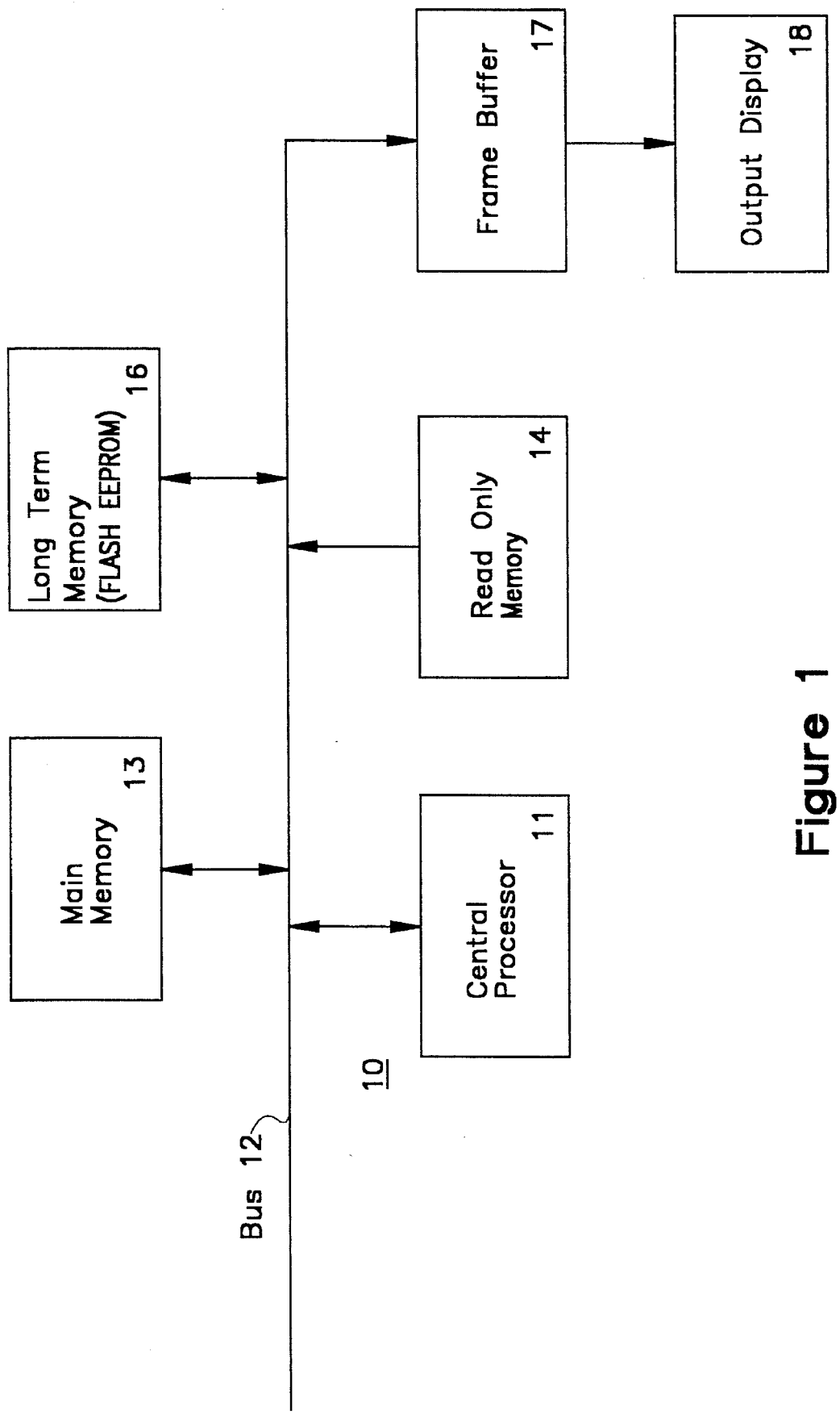
FIG. 1 is a block diagram of a computer system which may utilize the present invention.

Referring now to FIG. 1, there is illustrated a block diagram of a digital system configured in accordance with one embodiment of the present invention. The present invention has application in any system utilizing flash EEPROM memory arrays, such as a computer system. A portion of such a system 10 includes a central processing unit 11 which executes the various instructions provided to control the operations of the system 10. The central processing unit 11 is joined to a bus 12 adapted to carry information between the various components of the system 10. Joined to the bus 12 is main memory 13 which is typically constructed of dynamic random access memory arranged in a manner well known to those skilled in the prior art to store information during a period in which power is provided to the system 10.

Also connected to the bus 12 are various peripheral components such as long term memory 16 and circuitry such as a frame buffer 17 to which data may be written which is to be transferred to an output device such as a monitor 18 for display. Rather than the electro-mechanical hard disk drive which is typically used for long term memory, a flash EEPROM memory array may be used as the long term memory 16. Such a flash EEPROM memory array may be a single bit or a multi-level memory system (a memory system in which a memory cell may store more than one binary bit) and may include circuitry for controlling the operation of the memory array including all of the operations associated with reading, programming (writing), and erasing the memory array.

Figure 2:
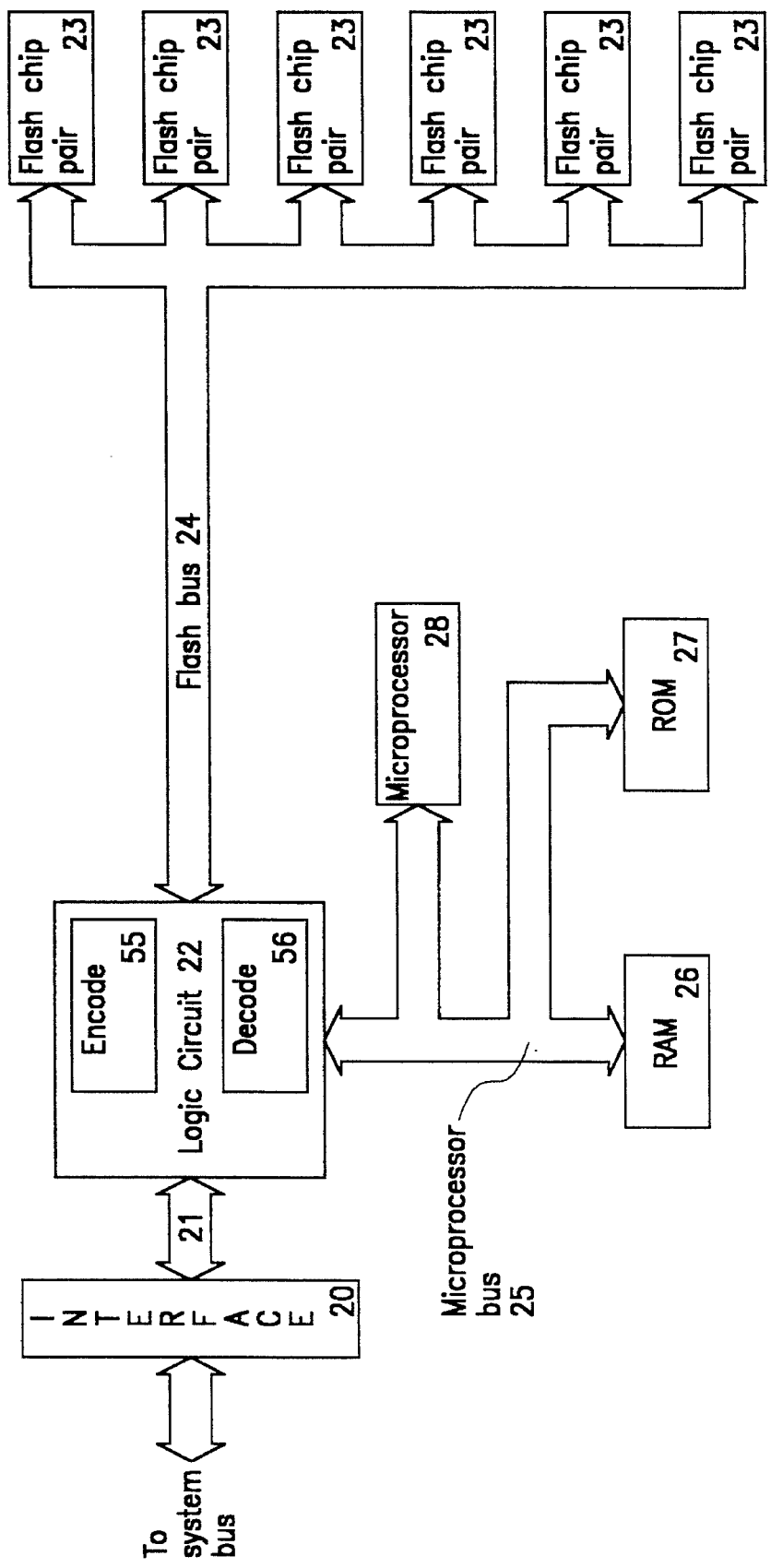
FIG. 2 is a block diagram of a flash EEPROM memory array constructed in accordance with the present invention.

FIG. 2 illustrates in block diagram form a memory system 16 such as that illustrated in FIG. 1. The memory system 16 is joined to the bus 12 through an interface 20. The interface 20 provides appropriate circuitry for providing signals furnished on the bus 12 to a flash system bus 21. The flash system bus 21 transfers signals between the interface 20 and a logic circuit 22. In one embodiment, this logic circuit 22 is an application specific integrated circuit (ASIC) which provides logic for implementing and coordinating the various operations of the flash memory system 16 such as reading, writing, erasing, and determining the status of the various portions of the flash EEPROM memory array. The logic circuit 22 functions as a command center and controls operations occurring in a plurality of flash EEPROM chip pairs 23 via a flash bus 24 so that those chips function together as a long term memory system. For the purposes of the present invention, it should be noted that encoder circuit 55 and decoder and correction circuit 56 are included within the logic circuit 22. As will be explained, these circuits 55 and 56 are utilized to accomplish a portion of the error detection and correction utilized in the present invention.

Figure 3:
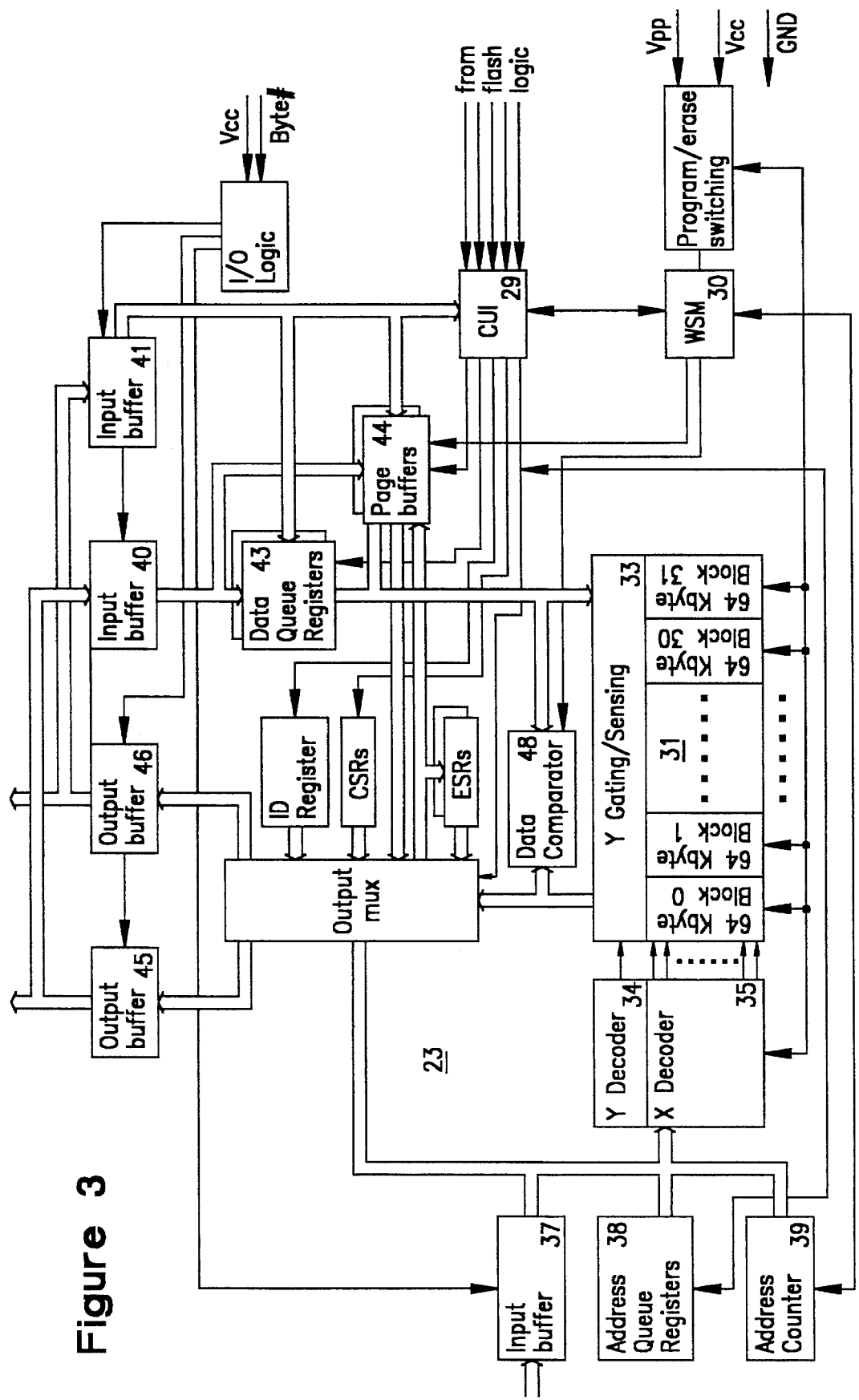
FIG. 3 is a diagram illustrating a pair of memory chips and control circuitry used in the memory array illustrated in FIG. 2.

The logic circuit 22 is assisted in its operations by a microprocessor 28 which is associated on a microprocessor bus 25 with random access memory 26, and read only memory 27. For the purposes of the present invention, the microprocessor 28, random access memory 26, and read only memory 27 function essentially as a general purpose processor in a manner well known to those skilled in the art. The read only memory 27 is utilized in one embodiment to store a process utilized in controlling a portion of the error detection and correction operation used in carrying out the invention In one embodiment, each pair of flash EEPROM memory chips 23 includes thirty-two blocks of memory transistors. Each chip of the pair 23 includes one-half of the memory transistors of the thirty-two blocks and control circuitry for effecting, among other things, read, write, and erase operations in the individual memory cells of the blocks on that chip pair 23. As is illustrated in FIG. 3 which shows one pair of flash chips upon which thirty-two blocks of the array may be situated, each flash chip pair 23 is joined to the flash bus 24 by a command user interface (CUI) 29. The user interface 29 provides command signals to the chip pair 23 from the logic circuit 22 of the flash system 16 and controls the transfer of data between the memory system 16 and the chip pair 23. The user interface 29 is associated with a write state machine 30 which is utilized to control write operations and certain internal operations of the chip pair 23. In one embodiment, the write state machine 30 includes a microcontroller including the typical registers, call stacks, program counter, and code and data storage areas to enable the execution of a number of commands which may be stored in the code storage area within the state machine 30.

The chip pair 23 of FIG. 3 includes a flash EEPROM memory array 31 which in the embodiment illustrated includes thirty-two individual blocks each including sixty-four kilobytes of flash EEPROM memory cells. As is shown in the figure, the array 31 includes Y gating/sensing circuitry 33 for controlling the bitlines and output sensing devices of the array 31. Y decoder circuitry 34 furnishes address information to the Y gating/sensing circuitry 33, while X decoder circuitry 35 furnishes addresses used to select wordlines during flash memory accesses. Addresses are furnished to the flash chip pair 23 at an address input buffer 37 which with an address queue register 38 and an address counter 39 controls the transfer of addresses to the chip pair 23.

Data is furnished to the chip pair 23 at a pair of input buffers 40 and 41 from which it may be transferred to a data queue register 43 or to a pair of page buffers 44. Each of the data queue registers 43 and the page buffers 44 provide a direct path to the array 31 under control of the write state machine 30. The page buffers 44 allow relatively large amounts of data to be accumulated and then written to the array 31 or to the host more rapidly than would be possible using individual read and write operations. Data is read to the system from the array 31 through a pair of output buffers 45 and 46 using an output multiplexor 47 which is controlled by the command user interface 29. The multiplexor 47 also allows the transfer of various system information from the page buffers 44, from an ID register, and from various other internal circuitry such as status registers under control of the command user interface 29. The status registers (CSRs and ESRs in the figure) may be read to determine the status of an operation such as write or erase, whether the operation is complete, and whether it has been completed successfully. These status registers also provide information of the state of each chip, the state of each block in a chip, the state of the command queue, and the mode in which the chip is operating. A data comparator 48 includes circuitry which functions with the command user interface to compare addresses furnished with any command to the chip pair 23 with the addresses on each block of the chip pair so that a logical address may be rapidly accessed.

The command user interface 29 of the memory chip pair 23 receives a number of commands from the flash system logic circuit 22. These may be categorized as read commands, write commands, and memory system maintenance commands. The read commands are executed within the chip pair 23 entirely under control of the interface 29. The write commands and many of the maintenance commands are executed by the interface 29 using the write state machine 30. This is especially true in embodiments in which the write state machine 30 includes a programmable microcontroller.

U.S. patent application Ser. No. 969,131, entitled A Method and Circuitry For A Solid State Memory Disk, Wells and Hasbun, filed Oct. 30, 1992, and assigned to the assignee of the present invention provides a further description of one arrangement for controlling the operation of a flash EEPROM memory array.

As is shown in FIG. 3, the array 31 is divided into a plurality of blocks of memory. In general, a flash EEPROM memory array is divided into blocks which are connected so that each entire block of memory cells may be erased simultaneously. With N-type complimentary metal-oxide-silicon (CMOS) memory devices, this erasure is typically accomplished by a high voltage value applied simultaneously to the source terminals of all the memory transistors of a block while the gate terminals of the devices are grounded and the drain terminals are floated. Such an erasure places each of the devices in the block into the erased condition. When in the erased condition, a device may be programmed to place a particular charge level on the floating gate. Historically, only one charge level greater than the erased level was utilized; and this level has been referred to as a "zero" or programmed condition. The erased state has been called a "one" or erased condition. A cell used to store charge at only these two charge levels is capable of storing a single bit of data. More recently, it has been found that a number of levels of charge in addition to the erased level may be stored on the floating gate of a flash EEPROM cell. With three charge levels in addition to the erased condition, a cell can store two bits of data.

Whether one or more bits are stored in a cell, since all of the source terminals of the memory transistors of a block of the array are joined together, a cell in a charged state cannot be switched to the erased state until the entire block of the array is erased once again. Thus, while an electro-mechanical hard disk drive typically stores information in a first area of the disk and then rewrites that same area of the disk when the information changes, this is not possible with a flash EEPROM memory array without erasing all of the valid information that remains in that portion of the array along with the invalid (dirty) information. Consequently, in a some arrangements, when the information at a data entry changes, the changed information is written to a new sector on a block of the array containing empty (erased) cells rather than written over the old data; and the old data is marked as invalid. Then, after a sufficient number of sectors on a block have been marked invalid, the entire block is erased. Typically, a flash array writes data to be stored in the array to some block of the array which contains erased cells. The write operation progresses sequentially in the block with empty sectors, sector by sector, until the block has been filled with data.

Because of this arrangement by which data is replaced, each block of the array will after some time have a number of entries which are marked as invalid and cannot be used for storage. Consequently, the array fills with data as the data previously stored is changed; and a point will come when it is necessary to clear the invalid information from a block in order to provide space for new or changed information to be stored. When erasure of a block occurs, all of the remaining valid data stored in the block to be erased is written to a new block; the space from which the data was read is marked invalid; and then the entire invalid block is erased (cleaned up) and put back into use as a clean block of memory.

It typically takes as much as a second to erase a block of an advanced flash EEPROM array. However, because erasure need not occur with each entry which is rewritten, erasure may be delayed until a block contains a sufficient amount of invalid information that cleanup is feasible. This reduces the number of erasure operations to a minimum and allows erasure to occur in the background when the facilities for controlling the array are not otherwise occupied with reading and writing.

Because of this arrangement by which data is replaced in the array by writing it to a different physical position, the physical address at which data is stored varies constantly. To indicate where specific data is stored, a logical sector number is assigned to and accompanies the data. Depending on the system implementation, this logical sector number may be the same sector number as is used by the host computer. The controller then searches for each logical sector number when the data in the array 10 is accessed.

Figure 4:
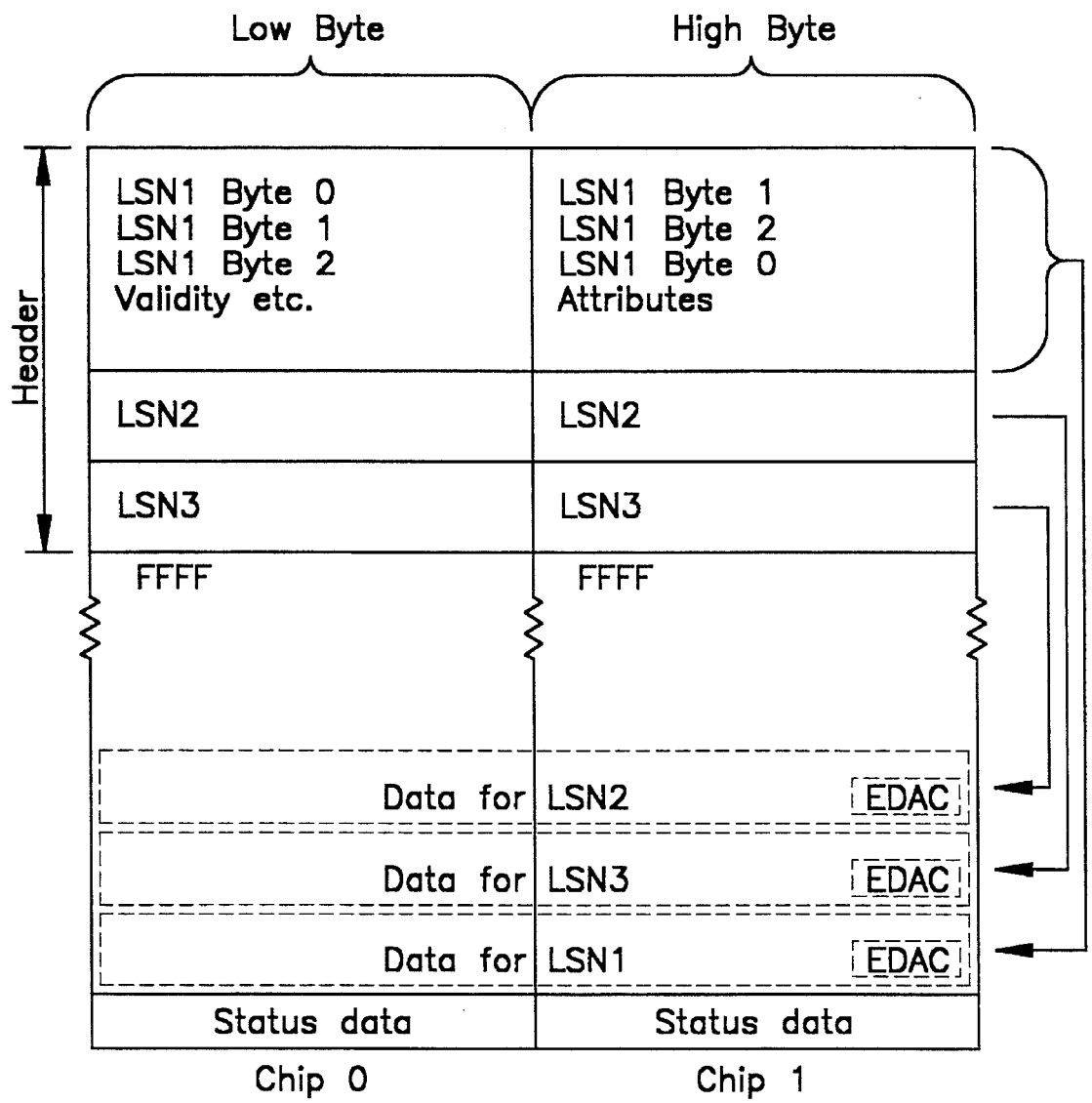
FIG. 4 is a diagram illustrating the arrangement of control information and data in a portion of a memory array constructed in accordance with the present invention.

FIG. 4 is an idealized drawing which illustrates one embodiment of an individual block of the array and is useful in describing the way data is stored. A typical block is illustrated as a large rectangular area. The area is divided into two individual physical chips in one embodiment. One of these chips adapted to function with sixteen bit words stores all of the low byte data for all of the blocks while the other chip stores all of the high byte data for all of the blocks. In one embodiment, each chip has its own individual control circuitry including a separate control user interface 29 and a separate write state machine 30. The area assigned on each chip for one block of the array includes a plurality of transistor devices typically arranged in rows and columns to provide the desired storage. The individual transistors and the various column and row select lines and other conductors for operating the block are not illustrated in FIG. 4 but are well known to those skilled in the art of designing flash EEPROM memory arrays.

As may be seen in FIG. 4, information is stored in each chip of the block 50 beginning at the top of the block and continuing to the bottom. At the top of each chip of the block 50 are identification fields which are referred to as sector translation tables or "headers." These identification fields store data including the logical sector numbers used as addresses for the data. For example, in one embodiment, a logical sector number is stored as three bytes in the header portion of the lower byte chip as a part of the first header at the top. In the figure, the logical sector number of the first sector stored in the first header is shown as "LSN1" although it might be any number within the range of the array. The same logical sector number is stored as three bytes arranged in a different order in the header portion of the high byte chip. A set of attributes and data for checking the validity of the header may also be included in the header area of the chips. These attributes include bits indicating whether data is stored in the data area below the header, whether the block is to be considered bad and unusable, a revision number, and the mode of storage. These fields allow the accurate retrieval of data in the sector.

Immediately below the first header for logical sector LSN1 are stored header data for each of the other sectors stored on the particular block of the array. Typically, approximately five hundred sectors are stored in a block of the array. Below the portion of the block including the headers on each chip of the block are stored the data for each of the logical sectors with headers at the top. This data includes error detection and correction code generated during write operations in an area labeled EDAC in the figure. In one embodiment, the data for logical sector LSN1 is stored at the bottom (in the figure) of the data portion of the block. Then the data for the next header from the top (logical sector LSN2) is stored next above the data for logical sector LSN1. This format continues throughout the block. Arrows in FIG. 4 illustrate the physical position at which the first byte of data for each of the logical sectors is stored. In the case of logical sector LSN1, which is the first sector on the block, the data is written from the byte at the position indicated by the arrow from the header for the sector number LSN1 in the header to a point at the bottom of the entire data storage area. FIG. 4 also shows a second arrow from the header for the logical sector labeled LSN2 to a physical position on the block which stores the first byte of the data for logical sector LSN2. As may be seen, since the sectors of data for the headers stored above are written from the bottom of the block up, an erased area is left between the headers and data which if read produces all "one" values which may be interpreted as the hexadecimal values FF, FF. These values may be used in managing the array.

At the very bottom of the block is stored additional status information useful in maintaining the array. In this area may be stored an indication referred to as "questionable" which indicates whether problems have occurred in accessing the block, an indication that the block is bad and is removed from service, and certain other data.

The manner in which the array is accessed during read and write operations in single bit mode may be understood by considering FIGS. 3 and 4. Before use, each of the blocks of the array is formatted to contain a header, empty storage space for data for each sector of 512 bytes which the block is able to store, and a status area. Most of these sectors in the array 31 are numbered when initially formatted with logical sector numbers in serial order, but a few blocks are formatted as unused and have no sector information in the header areas. In one embodiment, when data is to be written to the array 31, the data is furnished to the page buffers 44. A starting address for the data to be written is furnished to the page buffers 44 of the low byte chip of the array 31. The data in the page buffer is written to the data area of an unused sector of a block having empty space. The header area of this unused sector is written by the write state machine with the logical sector number furnished as the address.

With either a read or a write operation, a command word is also furnished to the interface 29 to be used in a search for the sector containing the data being updated. This command word includes information regarding a search for the header including whether one or two words are sought, whether the search is in single-bit or multi-bit mode, and how many words to increment. The interface 29 conducts a search for the sector in the array by searching each block from the top of the header area down until the logical sector number is found or is found to be absent from the block as is signified by the return of a data value "FF, FF" from the area immediately below the header area of the block. The interface 29 uses the circuitry of the data comparator to rapidly compare an address furnished with any command to the chip pair 23 with the addresses on each block of the chip pair sequentially so that a logical address may be rapidly accessed.

When the logical sector number is found on a block, the block and offset on the block of the sector are transferred back to the page buffer with an indication that the sector has been found. For a read operation, the interface 29 uses this address to accomplish the read operation. For a write operation whether an initial write or an update of data, the write state machine 30 looks for the indication that the sector has been found and uses the address to determine where the sector is stored in the array 31. Since the new data has been furnished to an unused sector and a new header constructed, the write state machine 30 marks the sector with the old data found on the block as invalid.

This operation occurs each time data in a particular logical sector is changed. The sector number is furnished to the page buffer 44 using the input address buffer 37. The interface 29 conducts a search to find the physical position of the logical sector. The sector found is marked invalid, and the header and data are written by the write state machine 30 to an empty sector somewhere on one of the blocks of the array 31.

When data is to be read, the logical sector number is furnished to the page buffer. The search is conducted; and, when a sector is located, the validity of the header is tested. If the header is valid, the data may be read. If these do not compare, the data is invalid and is so indicated.

Whenever a sector is marked invalid after the data has been written to a new area, the invalid sector is left to be cleaned up at some later time when a sufficient number of sectors on the block have been marked as invalid. Because the space marked invalid on a block cannot be released for use until the entire block is erased, each block of the array will after some time have a number of entries which are marked invalid and cannot be used for storage. Thus, the amount of invalid space in the array will mount as the array is used to store data. After some period of time, a sufficient number of blocks will be filled that it will be desirable to release space by moving the valid information from some especially dirty block to some other block and erasing the entire block from which the valid information has been removed. The process of writing valid data to other blocks and erasing a dirty block is referred to as "cleaning up a block" and has the effect of freeing an additional number of sectors equal to all of the sectors on the erased block which have previously been marked as invalid.

An arrangement has been devised which allows the individual memory cells of a flash EEPROM memory array to be operated in either single or multi-bit mode. The essence of such an arrangement is the provision of a first reference cell which is arranged in an arrangement similar to the arrangement of each bitline. The charge value stored by the reference cell is compared by a sense to the charge value stored by any selected memory cell. If the charge stored by the memory cell is less than that stored by the reference cell, the sense amplifier provides an output signal to indicate that the cell is erased. If the charge stored by the memory cell is greater than that stored by the reference cell, the sense amplifier provides an output signal to indicate that the cell is programmed.

In its simplest form, the arrangement also includes a second plurality of reference cells each of which stores a charge at a different level from the first level. The charge stored by any memory cell may be compared by sense amplifiers to each of these reference levels to determine the level of charge stored by the memory cell. In one embodiment, three reference levels are provided so that four different charge levels on the floating gate of a memory cell may be sensed. In order to operate the array in single bit mode, a signal is provided to switch the first reference cell into operation. In order to operate the array in multi-bit mode, a signal is provided to switch the second set of a plurality of reference cells into operation.

As has been pointed out above, error detection and correction code is stored with the data and allows the detection and correction of up to five bit errors in one embodiment. As has been described, a problem which occurs when operating the system in multi-bit mode is that leakage from the floating gates of some of the flash memory transistors can cause errors. This leakage is time related so that when memory cells have not been written within some period of time, leakage is more likely to occur; and some data may be lost. Whether leakage occurs in a short time or over a period of years, loss of data cannot be tolerated. For this reason, error detection and correction code is included with the data. In one embodiment, ten bytes of error detection and correction code is appended to the data stored in each sector.

The error detection and correction code is stored with each sector of data stored in the flash EEPROM array (represented by EDAC area in FIG. 4). This error detection and correction code allows detection and correction of single and multiple bit errors. Error detection and correction code of this type is well known to those skilled in the art and is widely used in protecting data stored on electro-mechanical hard disks. Examples of error correcting code and the operation such code performs are detailed, for example, in *Practical Error Correction Design For Engineers*, Revised 2d Edition, Glover and Trent, published by Cirrus Logic Press, copyright 1990.

FIG. 6 illustrates a simplistic method of error detection and correction which may be utilized for errors in the two storage arrangements described above. The method is illustrated to explain the problems associated with detecting and correcting errors in row and column organized memory arrays. For this purpose, only four rows and four columns of memory cell positions are shown. The method utilizes a parity checking arrangement in which each row and each column are assigned values depending on whether the total of one values stored in the particular row or column is an even or odd number. If the total of one values is odd as in the first, third, and fourth rows, a one is stored with the detection and correction code to bring the value to an even number. If the total is even as in the second, third, and fourth columns, a zero is stored with the detection and correction code so that the total remains an even number. These error checking bits are typically stored in the sector with the data as the data is written. In one embodiment of the invention, ten bytes of this type of error checking and correcting data are stored. When the data is read from the sector, the parity check bits of the detection and correction code may be checked against the values of the data read. It will be seen that if a single bit error has occurred, the parity bits for a single column and a single row will not match the total of the values read. For example, if the one value stored at the intersection of the third row and the third column is read as a zero, then the parity value for the row will be zero while the stored parity bit for the row is one; and the parity value for the column will be one while the stored parity bit is a zero. These two failures during an error checking comparison show that the bit at the intersection is incorrect and allow that bit to be corrected to the proper one value.

As may be seen from FIG. 6, it is also possible with the simple parity checking error correction and detection scheme illustrated to detect multiple errors which occur in a single row and multiple errors which occur in different rows. It may be possible to correct some of these errors but others will be uncorrectable with the scheme illustrated. For example, if two bits fail in the third column, each of the rows in which the bits fail will exhibit an incorrect parity bit while the column will have the correct parity bit. Consequently, even though it is clear that errors have occurred in particular rows, it is not known which bits in the rows are in error so a correction cannot be made with this simple scheme. Various more complicated error detecting and correcting schemes are available, and such schemes will go much further in detecting and correcting errors. As explained above, it is expected that more complicated schemes than that shown would be used with the present invention. More particularly, codes referred to as Bose, Chaudhuri, and Hocquenghem (BCH) code which are well known in the prior art are especially useful as the error detecting and correcting codes to be used in the present invention. This is because the type of errors most likely to occur are random and separate in nature, and the BCH codes are powerful random error-correcting codes. For this reason, these codes are preferred in the present invention. A description of BCH codes and the methods of implementing these codes is provided in a number of references including, for example, *Error Control Coding: Fundamentals and Applications*, Chapter 6, Shu Lin and D. Costello, Jr., Prentice-Hall, 1983.

In one embodiment, the coding and decoding circuitry of the error detection and correction circuitry is a portion of the logic circuit 22 which controls the operation of the flash system 16. This includes the encoding circuit 55 and the decoding and correction circuit 56. The encoding circuit 55 receives the data to be written to the flash memory array and generates the EDAC code to be stored with each sector of data. The decoding and correcting circuit 56 includes circuitry through which data read from the flash array is processed to provide a second EDAC code, a comparator for determining that the codes match so that there is no error, and correction circuitry. In one embodiment the correction circuitry detects in hardware errors up to two, determines the position of those errors, and corrects them all in a manner well known to the prior art. If more than two errors are found to be present, the circuit 56 transfers the operation to the error correction process stored in read only memory 27. This process counts the number of errors, determines their positions, and corrects errors which may be detected. Thus, the entire error detecting and correcting process makes use of this circuitry and of firmware stored in the read only memory 27 to carry out various portions of the operation discussed herein. In one embodiment of the array, the code utilized has been optimized to provide for detection of up to six errors and correction of five errors. This requires the generation of ten bytes of coded data by the error detection and correction circuitry for each sector of data stored in a block of the array. This coded data is stored with the data in the data portion of the sector. In order to make sure that the data stored is not lost over long periods of time, a method has been devised to assure that the sectors of a disk are checked using the error correction code so that the number of errors which build up in a sector of data does not reach the level at which complete correction cannot be accomplished. This may be accomplished by running the program of the present invention at some regular interval. For example, the program may be run each time the flash EEPROM array is read in order to check for sectors which are being used. Alternatively, the program may be run each time the array is cleaned up, each time the array is placed in the "on" condition, or at some other interval which will assure that the array is constantly checked so that a buildup of errors does not occur. In order to assure that sectors which are not used frequently are checked, an indication of last use may be stored with the data stored in a sector and some number of least frequently used sectors run through the error detection and correction circuitry at some regular interval. An alternative method for detecting whether errors are accumulating in little used areas of the array is to provide a process for checking random sections of the array with the program of the present invention each time power is applied to the system or at some other opportune time.

It will occur to those skilled in the art that data related to certain application programs which are utilized often is of a type which will be most subject to this data loss problem. A program is written to the flash EEPROM array and then used only infrequently for unusual operations. After some period, some of the data begins to be lost as leakage from floating gates of some of the individual cells occurs. If a sector which has been stored for some period without rewriting is tested using error correction code before the error level is allowed to reach more than five errors, then all of the errors can be corrected; and no data will be lost. However, if too long a period passes and leakage causes more than five errors to occur in a sector, then the error correction code cannot be used to correct the data.

Figure 5:
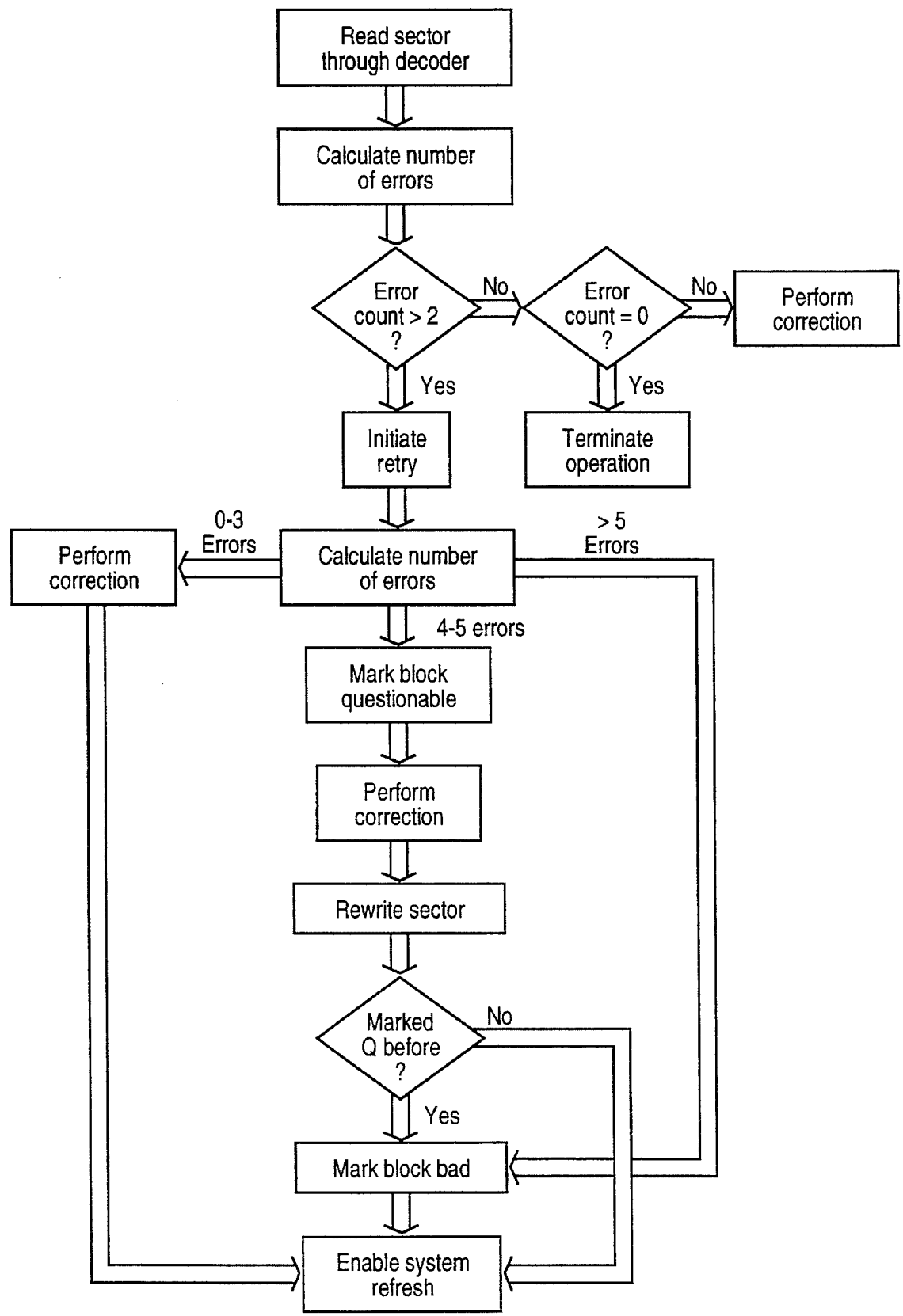
FIG. 5 is a flow chart illustrating a method practiced in accordance with the present invention.

FIG. 5 is a flow chart illustrating a method in accordance with the present invention for correcting errors in a flash EEPROM memory array utilizing multi-bit storage. The method begins whenever a sector of the array is read or cleaned up. This method may also be instituted at some regular interval (such as system start up) to check little used portions of the array in some organized or random pattern in order to detect accumulating errors. In the first step of the method, the data in the sector is read through the error correction circuitry of the system and the number of errors in the sector is detected using the circuit 56. Typically, there will be no errors, and this will cause the program to move to a step in which the error detection program is terminated. The data may then be read. If there are less than two errors in the sector, then the program utilizes the error detection and correction circuit 56 illustrated in FIG. 2 to correct the errors very rapidly and terminates; again, the data may be read at that point. The hardwired circuitry is utilized for correcting less than three errors because it is relatively economical to build circuitry for to correct this many errors.

If there are greater than two errors in the sector, the program moves to a step in which a retry of the error detection process is initiated and the errors are again counted. It has been estimated that a majority of the errors which are likely to occur are caused by noise in the system. It has been predicted that this will occur less than once in each 450,000 sectors which are read so a retry operation overcomes this problem. Consequently, providing a retry operation after a first detection operation in which a number of errors are encountered is quite advantageous in eliminating other steps of the process. Typically, such a retry operation is conducted by the process stored in read only memory 56 which carries out the same algorithm in firmware as was carried out by the original operation. It should be noted that it is also possible to retry the operation and provide a longer period for the memory devices to latch before the comparison with the reference devices is made. This slower retry eliminates errors from those cells which simply react at a slightly slower rate.

After this retry of the operation, the number of errors are calculated again. The firmware algorithm has the ability to detect six errors and to correct five of those errors. If there are still from zero to three errors, errors not due to system noise are probably present; and an error correction is performed using the firmware error correction process. After the correction, the program moves to a step at which a system refresh is implemented. Such a refresh applies the steps of the original process being described to all of the sectors of the array in order to determine if any sectors are in fact failing due to charge loss of the memory devices.

If on the other hand, there are from four to five errors detected in the sector, the block is marked as "questionable" in the status area below the position at which data is stored on the relevant blocks of the chip. After the block has been so marked, the correction is performed to the data at each position which has occasioned the errors. Then the sector is rewritten to a new position on the array. At this point, the block is tested to determine whether the block has been marked "questionable" twice. If not, then the program moves to a step at which system refresh is enabled. If the block has been marked as questionable previously, then the block is marked "bad" in the status area of the block so that it may be taken from service. After the block has been marked bad, a system refresh is enabled.

If the number of errors is greater than five, then the data cannot be corrected. Consequently, the block is marked bad immediately so that it may be removed from service and a system refresh is initiated.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A method of managing data in a flash electrically-erasable programmable read only memory (EEPROM) array including separately erasable blocks of memory devices arranged to stored data in sectors, the method comprising the steps of:

detecting errors present in a sector of an array being read, terminating the detection process if no errors are detected, correcting the errors if less than a first number of errors are detected, retrying the detection of errors in the sector of an array if greater than the first number of errors is detected, correcting the errors after the retrying if less than a second number of errors greater than the first number of errors are detected, marking the block of the array questionable if more than the second number of errors but less than a third number of errors is detected, which is the greatest the error detection process is able to correct, is detected; and then correcting the errors which are detected, rewriting the sector of data to a new position, checking whether the block has been marked questionable previously, if the block has been marked questionable previously, removing the block from service; and if more than the third number of errors is detected, removing the block from service.

2. A method in accordance with claim 1 further comprising a step of enabling a system refresh after any error correction following a retry of detection or a removal of a block of the array from service.

3. A method in accordance with claim 1 in which each step of detection or correction is carried out using Bose, Chaudhuri, and Hocquenghem (BCH) code.

4. A method in accordance with claim 1 which is enabled at regular intervals in sectors of an array which are used infrequently in order to detect and correct errors due to leakage in such sectors.

5. A method in accordance with claim 4 which is enabled in random sectors of the array.

6. A method in accordance with claim 1 in which the step of retrying the detection of errors is accomplished at a slower read speed if the number of errors is greater than the first number.

7. A method in accordance with claim 1 in which the step of detecting errors present in a sector of an array being read and the step of correcting the errors if less than a first number of errors are detected are each accomplished by hardware, and the remaining detection and correction steps are accomplished by a computer implemented software process.

8. A method in accordance with claim 1 in which each step of detecting errors present in a sector of an array includes the steps of:

detecting the number of errors present in a sector of an array being read; and determining the position of each of the errors detected.

9. A method of managing data in a flash electrically-erasable programmable read only memory (EEPROM) array including separately erasable blocks of memory devices arranged to stored data in sectors, the method comprising the steps of:

detecting errors present in a sector of an array being read, determining the number of errors and the position of each of the errors detected, terminating the detection process if no errors are detected, correcting the errors if less than a first number of errors are detected, marking the block of the array questionable if more than the first number of errors but less than a second number of errors is detected is detected; and then correcting the errors which are detected, rewriting the sector of data to a new position, checking whether the block with errors has been marked questionable previously;

if the block has been marked questionable previously, removing the block from service; and if more than the second number of errors is detected, removing the block from service.

10. A method in accordance with claim 9 which further includes before any of the steps recited, the steps of detecting errors present in a sector of an array being read, terminating the detection process if no errors are detected, and correcting the errors if less than the first number of errors are detected.

11. A method in accordance with claim 10 in which the initial steps of detecting errors present in a sector of an array being read and correcting the errors if less than the first number of errors are detected are each accomplished by hardware.

12. A method in accordance with claim 9 in which each of the steps is accomplished by a computer implemented software process.

13. A method in accordance with claim 9 further comprising a step of enabling a system refresh after any error correction or removal of a block of the array from service.

14. A method in accordance with claim 9 in which the each step of detection or correction is carried out using Bose, Chaudhuri, and Hocquenghem (BCH) code.

15. A method in accordance with claim 9 which is enabled at regular intervals in sectors of an array which are used infrequently in order to detect and correct errors due to leakage in such sectors.

16. A method in accordance with claim 15 which is enabled in random sectors of the array.

17. A method in accordance with claim 9 in which the second step of detecting errors is accomplished at a slower read speed if the number of errors is greater than the first number.

18. A method in accordance with claim 9 in which each step of detecting errors present in a sector of an array includes the steps of:

detecting the number of errors present in a sector of an array being read; and determining the position of each of the errors detected.

* * * * *